(12) United States Patent
Collins et al.

(10) Patent No.: US 7,064,688 B2
(45) Date of Patent: Jun. 20, 2006

(54) SYSTEM AND METHOD FOR COMPRESSING DATA ON A BANDWIDTH-LIMITED NETWORK

(75) Inventors: Roger Collins, Novato, CA (US); John Lawrence Friend, Los Altos, CA (US)

(73) Assignee: Good Technology, Inc., Santa Clara, CA (US)

( * ) Notice: Subject to any disclaimer, the term of this patent is extended or adjusted under 35 U.S.C. 154(b) by 580 days.

(21) Appl. No.: 09/902,060

(22) Filed: Jul. 9, 2001

(65) Prior Publication Data

US 2003/0006919 A1 Jan. 9, 2003

(51) Int. Cl.
*H03M 7/00* (2006.01)
*H03M 7/30* (2006.01)
*H03M 7/34* (2006.01)
*H03M 7/38* (2006.01)

(52) U.S. Cl. .............................. 341/87; 341/51; 341/106
(58) Field of Classification Search ............... 341/87, 341/50, 51, 95, 106; 709/206, 204, 315; 235/431; 711/170, 201; 707/104.1, 10; 379/100.08, 379/93.24
See application file for complete search history.

(56) References Cited

U.S. PATENT DOCUMENTS

| | | | | |
|---|---|---|---|---|
| 4,682,150 A | * | 7/1987 | Mathes et al. ............... 235/431 |
| 5,049,881 A | * | 9/1991 | Gibson et al. ................. 341/95 |
| 5,126,739 A | * | 6/1992 | Whiting et al. .............. 341/106 |
| 5,159,592 A | | 10/1992 | Perkins |
| 5,553,281 A | * | 9/1996 | Brown et al. ............. 707/104.1 |
| 5,559,800 A | | 9/1996 | Mousseau et al. |
| 5,563,595 A | * | 10/1996 | Strohacker ................... 341/106 |
| 5,715,387 A | | 2/1998 | Barnstijn et al. |
| 5,727,202 A | | 3/1998 | Kucala |
| 5,760,716 A | * | 6/1998 | Mathews et al. .............. 341/50 |
| 5,790,974 A | | 8/1998 | Tognazzini |
| 5,802,312 A | | 9/1998 | Lazaridis et al. |
| 5,930,471 A | * | 7/1999 | Milewski et al. ............ 709/204 |
| 5,961,590 A | | 10/1999 | Mendez et al. |
| 6,023,708 A | | 2/2000 | Mendez et al. |
| 6,219,694 B1 | | 4/2001 | Lazaridis et al. |
| 6,223,227 B1 | * | 4/2001 | Williamson et al. ......... 709/315 |
| 6,275,848 B1 | * | 8/2001 | Arnold ......................... 709/206 |
| 6,298,321 B1 | * | 10/2001 | Karlov et al. .................. 704/10 |
| 6,320,523 B1 | * | 11/2001 | York et al. .................... 341/106 |
| 6,330,618 B1 | | 12/2001 | Hawkins et al. |
| 6,396,482 B1 | | 5/2002 | Griffin et al. |

* cited by examiner

*Primary Examiner*—Patrick Wamsley
(74) *Attorney, Agent, or Firm*—Blakely Sokoloff Taylor & Zafman, LLP

(57) ABSTRACT

A method for compressing a message is disclosed, comprising: identifying a block of data within the message which is found in a previous message; generating a pointer identifying the block of data in said previous message; and replacing the block of data with the pointer in the message.

24 Claims, 12 Drawing Sheets

Header Info 305
From: "Smith, John" <jsmith@bstz.com> on 04/30/2001 11:25:21 PM
To: "Webster, Tom" <thomas_webster@bstz.com>, "Collins, Roger" <rcollins@good.com>
Cc: "Watson, Mark" <marky@good.com>, "O'Rourke, Rob" <o'rourke@good.com>, "Taylor, >Ed" <ed_taylor@bstz.com>
Subject: Patent Issues

Text 310

Enclosed are the agreements we need to review at our meeting. We will be required to sign them to participate in the NU-2 standards committee.
*JS*

John Smith
Blakely, Sokoloff, Taylor & Zafman LLP
1279 Oakmead Parkway
Sunnyvale, CA 94085-4040
Tel: 408.720.8300
Fax: 408.720.9397

Electronic Signature 315

CONFIDENTIALITY NOTICE
This electronic message and its accompanying attachments (if any) contain information from the law firm of Blakely Sokoloff Taylor & Zafman LLP that is confidential and/or subject to attorney-client privilege. If you are not the intended recipient, be aware that any disclosure, copying, distribution, or use of the contents of this information is prohibited. If you have received this message in error, please notify the above attorney by telephone immediately.

 - Agreements.doc

Attachment 320

Message 300

FIG. 3a

Header Info 335
From: "Collins, Roger" <rcollins@good.com>
Sent: Tuesday, May 01, 2001 9:55 AM
To: "Webster, Tom" <thomas_webster@bstz.com>, "Smith, John" <jsmith@bstz.com>
Cc: "Watson, Mark" <marky@good.com>,
"O'Rourke, Rob" <o'rourke@good.com>, "Taylor, Ed" <ed_taylor@bstz.com>
Subject: RE: Patent Issues

Text 340
Tom, in the meantime, it would be helpful if you could identify whether
Good is likely to have any patents or patent applications that
might fall within the scope of the various license back provisions in any
of these agreements as outlined in the summary.

Characters inserted
by email system 316

> From: "Smith, John" <jsmith@bstz.com> on 04/30/2001 11:25:21 PM
> To: "Webster, Tom" <thomas_webster@bstz.com>, "Collins, Roger"
> <rcollins@good.com>
> Cc: "Watson, Mark" <marky@good.com>, "O'Rourke, Rob"
> <o'rourke@good.com>, "Taylor, >Ed" <ed_taylor@bstz.com>
> Subject: Patent Issues > Enclosed are the agreements we need to review at our meeting. We will
> be required to sign them to participate in the NU-2 standards committee.
> *JS*

> John Smith
> Blakely, Sokoloff, Taylor & Zafman LLP
> 1279 Oakmead Parkway
> Sunnyvale, CA 94085-4040
> Tel: 408.720.8300
> Fax: 408.720.9397

> CONFIDENTIALITY NOTICE
> This electronic message and its accompanying attachments (if any) contain information
> from the law firm of Blakely Sokoloff Taylor & Zafman LLP that is confidential and/or
> subject to attorney-client privilege. If you are not the intended recipient, be aware that
> any disclosure, copying, distribution, or use of the contents of this information is
> prohibited. If you have received this message in error, please notify the above attorney
> by telephone immediately.

- Agreements.doc  Attachment 320

Message 300 / Message 301

FIG. 3b

| Symbol | Probability | Code Word |
|---|---|---|
| @good.com | .2 | 00 |
| (408) 720- | .1 | 10 |
| (650) | .05 | 11 |
| .@bstz.com | .05 | 010 |
| 94086 | .04 | 011 |

Code Word Table

*Fig. 7*

SYSTEM AND METHOD FOR COMPRESSING DATA ON A BANDWIDTH-LIMITED NETWORK

BACKGROUND

1. Field of the Invention

This invention relates generally to the field of network data services. More particularly, the invention relates to an apparatus and method for compressing data for transmission over a bandwidth-limited network.

2. Description of the Related Art

A variety of wireless data processing devices have been introduced over the past several years. These include wireless personal digital assistants ("PDAs") such as the Palm® VIIx handheld, cellular phones equipped with data processing capabilities (e.g., those which include wireless application protocol ("WAP") support), and, more recently, wireless messaging devices such as the Blackberry™ wireless pager developed by Research In Motion ("RIM").™

These devices employ various data compression techniques to compress data before transmitting the data over the wireless network (i.e., to conserve network bandwidth). Two such compression techniques are known as Huffman coding and Lempel-Ziv-Welch ("LZW") compression. Huffman coding is a statistical compression algorithm that converts characters into variable-length bit strings. Characters occurring more frequently are converted to relatively shorter bit strings; characters occurring less frequently are converted to relatively longer bit strings. Huffman compression is generally accomplished in two passes. In the first pass, the Huffman algorithm analyzes a block of data and creates a tree model based on its contents. In the second pass, the algorithm compresses the data using the tree model. During decompression, the variable length strings are decoded using the tree model.

LZW compression works by generating pointers which identify repeating blocks of data to reduce redundancy in the bitstream. For example, if the same 30-byte chunk of data occurs several times, the initial occurrence is preserved but any future occurrences are replaced by a pointer to the initial occurrence, thereby significantly reducing the bandwidth consumed by the bitstream (i.e., assuming that each pointer will be smaller than 30 bytes). Winzip,™ the well-known file compression tool, employs a form of LZW compression.

There are numerous reasons why reducing the amount of data transmitted over a wireless network is important. Wireless networks are generally more bandwidth-limited than wired networks. As such, these networks can only concurrently support a limited number of devices transmitting at a given bitrate. The more the transmitted data can be compressed, the greater the number of devices which can concurrently communicate over the network.

Moreover, transmitting data from a wireless device consumes a significant amount of energy. As such, decreasing data transmissions will increase battery life on the device. In addition, because wireless carriers typically charge customers based on the amount of data transmitted (or by the amount of time spent "online" which is generally proportional to the amount of data transmitted), reducing the amount of transmitted data will result in a lower cost to the end user.

Accordingly, what is needed is a system and method which will provide greater compression than current compression techniques when transmitting data over a bandwidth-limited network.

SUMMARY

A method for compressing a message is disclosed, comprising: identifying a block of data within the message which is found in a previous message; generating a pointer identifying the block of data in the previous message; and replacing the block of data with the pointer in the message.

BRIEF DESCRIPTION OF THE DRAWINGS

A better understanding of the present invention can be obtained from the following detailed description in conjunction with the following drawings, in which:

FIGS. 3*a–c* illustrate an exemplary sequence of related email messages.

FIG. 7 illustrates a code word table employed to compress data according to one embodiment of the invention.

DETAILED DESCRIPTION

In the following description, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form to avoid obscuring the underlying principles of the present invention.

An Exemplary Network Architecture

Figure 1:
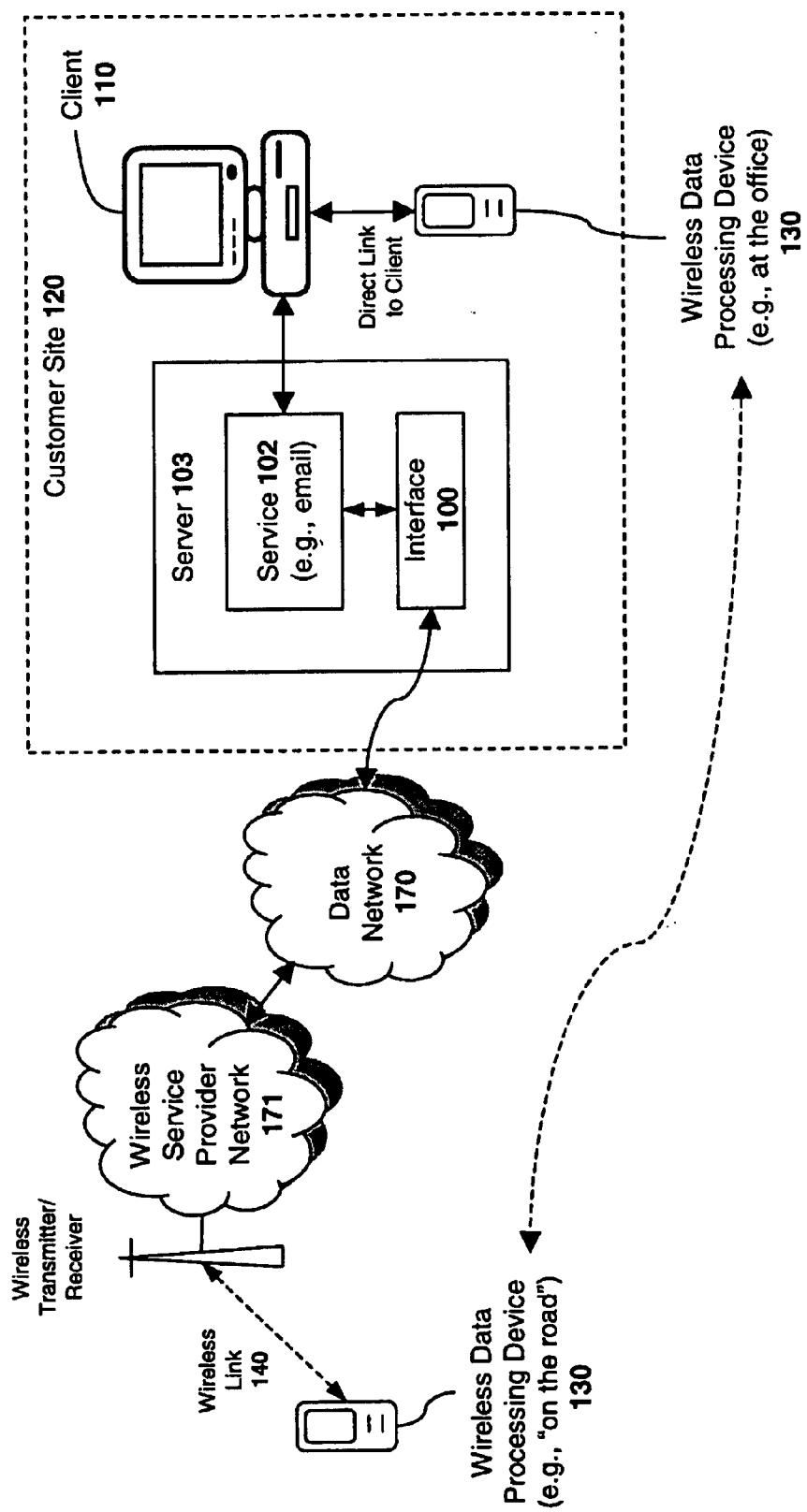
FIG. 1 illustrates an exemplary network architecture used to implement elements of the present invention.

FIG. 1 illustrates one embodiment of a network architecture for implementing the compression techniques described herein. The "customer site" 120 illustrated in FIG. 1 may be any local-area or wide-area network over which a plurality of servers 103 and clients 110 communicate. For example, the customer site may include all servers and clients maintained by a single corporation. The servers 103 may be configured to provide a variety of different messaging and groupware services 102 to network users (e.g., email, instant messaging, calendaring, . . . etc). In one embodiment, these services are provided by Microsoft Exchange.™ However, the underlying principles of the invention are not limited to any particular messaging groupware platform.

In one embodiment of the invention, an interface 100 forwards data maintained by the service 102 (e.g., email messages, instant messages, calendar data, . . . etc) to a plurality of wireless data processing devices (represented in FIG. 1 by wireless device 130) via an external data network 170 and/or a wireless service provider network 171. For example, if the service 102 includes an email database, the interface 100 forwards any new emails which arrive in a user's mailbox on the service 102 to the user's wireless data processing device 130 (over the network(s) 170 and/or 171). Alternatively, or in addition, the service 102 may forward the email to the user's local computer (e.g., client 110) (i.e., so that the user will receive the email on his/her wireless device 130 when out of the office and on his/her personal computer 110 when in the office). Conversely, email messages sent from the user's wireless data processing device 130 are transmitted to the service 102 via the interface 100.

In one embodiment, the interface 100 is a plug-in software module adapted to work with the particular service 120. It should be noted, however, that the interface 100 may be implemented in hardware or any combination of hardware and software while still complying with the underlying principles of the invention.

In one embodiment, the external data network 170 is comprised of a plurality of servers/clients (not shown) and other networking hardware (e.g., routers, hubs, . . . etc) for forwarding data between the interface 100 and the wireless devices 130. In one embodiment, the interface 100 encapsulates data in one or more packets containing an address identifying the wireless devices 130 (e.g., such as a 24-bit Mobitex Access Number ("MAN #")). The external data network 170 forwards the packets to a wireless service provider network 171 which transmits the packets (or the data contained therein) over a wireless communication link to the wireless device 130. In one embodiment, the wireless service provider network is a 2-way paging network. However, various other network types may be employed (e.g., CDMA 2000, PCS, . . . etc) while still complying with the underlying principles of the invention.

It should be noted that the network service provider network 171 and the external data network 170 (and associated interface 100) may be owned/operated by the same organization or, alternatively, the owner/operator of the external data network 170 may lease wireless services from the wireless service provider network. The underlying principles of the invention are not limited to any particular service arrangement.

State-Based Compression Embodiments

Figure 2:
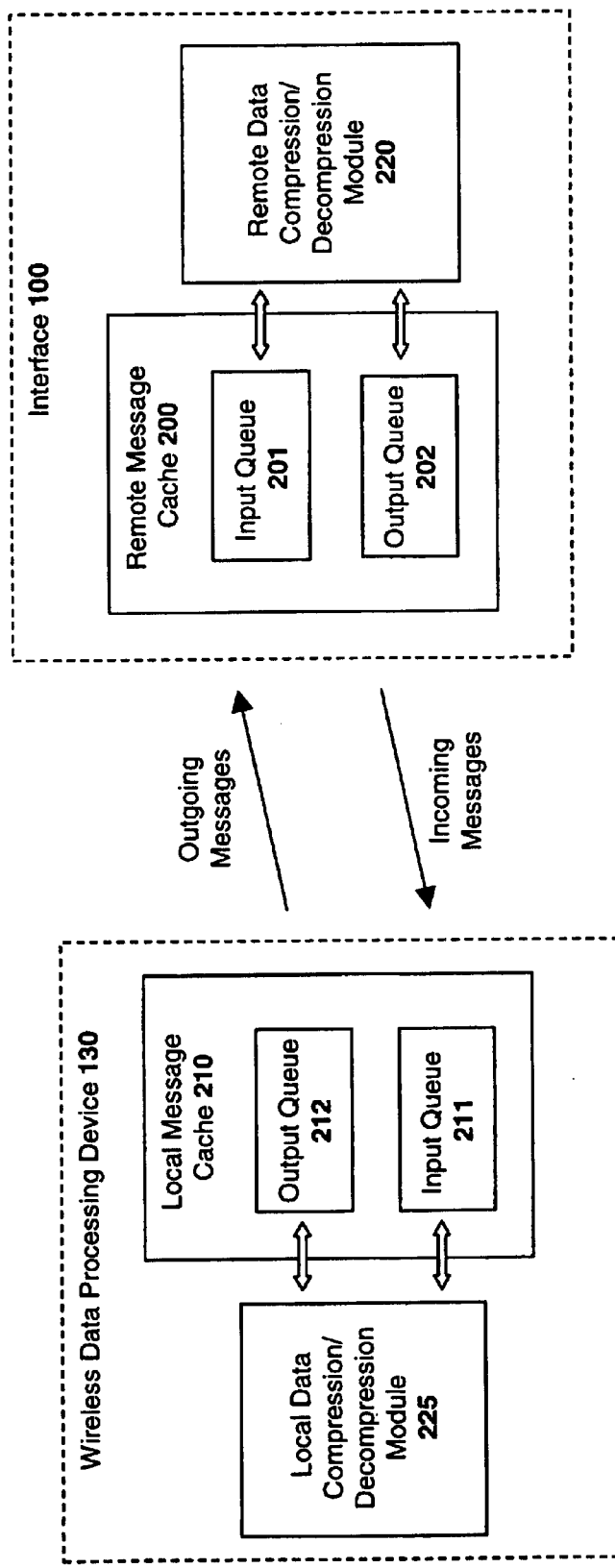
FIG. 2 illustrates one embodiment of a system for compressing data.

FIG. 2 illustrates certain aspects of the wireless data processing device 130 and the interface 100 in greater detail. In one embodiment, the data processing device 130 is comprised of a local data compression/decompression module 225 (hereinafter "codec module 225") and a local message cache 210. The local codec module 225 compresses outgoing data and decompresses incoming data using the various compression techniques described herein.

The local message cache 210 is comprised of an input queue 211 for temporarily storing a incoming messages and an output queue 212 for storing outgoing messages. Although illustrated as separate logical units in FIG. 2, the local message cache 210 may be comprised of only a single block of memory for storing both incoming and outgoing messages according to a cache replacement policy. In one embodiment, messages are maintained in the input queue and/or output queue using a first-in, first-out ("FIFO") replacement policy. However, various other cache replacement techniques may be employed while still complying with the underlying principles of the invention. For example, a least-recently used ("LRU") policy may be implemented where messages used least frequently by the local codec module 225 are stored in the cache for a shorter period of time than those used more frequently. As described below, messages used more frequently by the local codec module 225 may frequently include messages which form part of a common email thread, whereas those used less frequently may include junk mail or "spam" (i.e., for which there is only a single, one way message transmission).

The interface 100 of one embodiment is comprised of a remote data compression/decompression module 220 (hereinafter "codec module 220") and a remote message cache 200 with a remote input queue 201 and a remote output queue 202. The codec module 220 compresses messages transmitted to the wireless data processing device 130 and decompresses messages received from the data processing device 130 according to the techniques described herein. The remote message cache 200 temporarily stores messages transmitted to/from the data processing device 130 (e.g., using various cache replacement algorithms as described above). In one embodiment, the cache replacement policy implemented on the interface 100 is the same as the policy implemented on the wireless device 130 (i.e., so that cache content is synchronized between the remote cache 200 and the local cache 210).

Figure 3C:

FIGS. 3a–c illustrate an exemplary sequence of email messages which will be used to describe various aspects of the invention. FIG. 3a illustrates the initial email message 300 in the sequence which (like most email messages) is logically separated into a header information portion 305 and a text information portion 310. Also shown in FIG. 3a is an attachment 320, indicating that a document is attached to the message and an electronic signature which may be automatically inserted in the message by the sender's (i.e., John Smith's) email client.

FIG. 3b illustrates the second email message 301 in the sequence transmitted by user Roger Collins in response to the initial email message. As indicated by the new header information 335, this message is transmitted directly to the initial sender, John Smith, and to a user who was CC'ed on the initial email message, Tom Webster. The message is also CC'ed to everyone else in the group to whom the initial message was transmitted. This "reply to all" feature, which is found in most email clients, provides a simple mechanism for allowing a sequence of email messages to be viewed by a common group of individuals.

As illustrated in FIG. 3b, the text 310 of the initial email message 300 is substantially reproduced in the new email message. This "reply with history" feature is also common to most email clients, allowing a sequence of comments from the individuals in the common group to be tracked from one email message to the next. Also illustrated are a plurality of characters 316 inserted by the responder's (Roger Collins') email system at the beginning of each line of the original email text. This feature, which is common in some (but not all) email systems, allows users to differentiate between new text and old text.

Accordingly, even after the initial email response in a sequence of emails, the email history (i.e., the portions of text and attachments reproduced from prior messages) represents a significant portion of the overall message, resulting in the transmission of a significant amount of redundant information being transmitted over the wireless network, in both the text portion of the email and the header portion of the email.

FIG. 3c illustrates the final email message 302 in the sequence in which the addressee of the second email responds to the sender of the second email and CC's all of the other members in the group. As illustrated, the only non-redundant information in the email message 302 is a few lines of text 355. The email addresses of all of the group members are the same as in the previous two messages (although switched between different fields, the underlying addresses are the same) and the text and header information from the previous messages 300, 301, including the attachment 320 are reproduced, with only a few minor modifications (e.g., the additional ">" characters inserted by the email system).

One embodiment of the invention compresses email messages by taking advantage of this high level of redundancy. In particular, rather than sending the actual content contained in new email messages, portions of the new messages identified in previous email messages stored in the caches 200, 201 are replaced by pointers to the redundant portions. For example, in message 302 all of the redundant content from message 301 may be replaced by a pointer which identifies the redundant content in message 301 stored in the cache of the user's wireless device. These and other compression techniques will be described in greater detail below.

Figure 4:
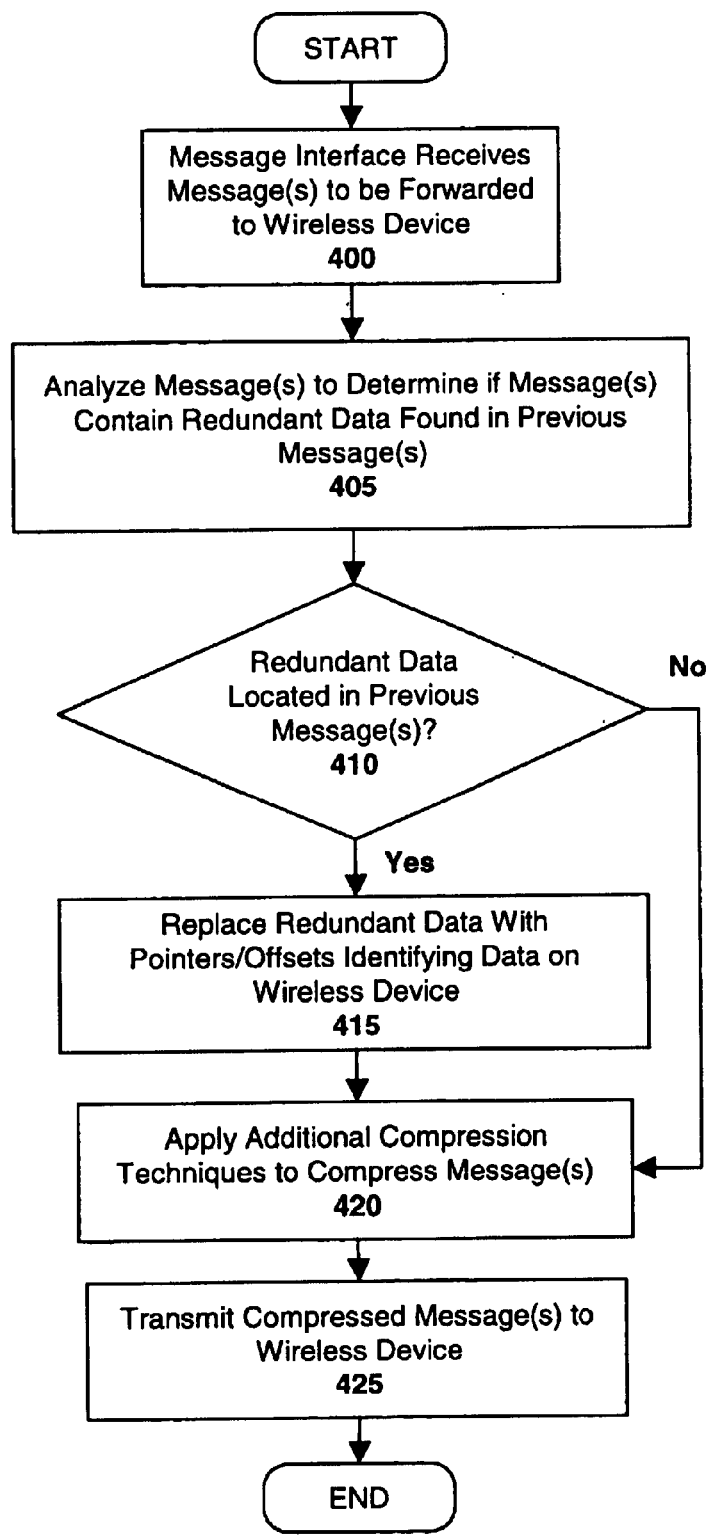
FIG. 4 illustrates one embodiment of a method for compressing data using redundant data found in previous messages.

FIG. 4 illustrates one embodiment of a method for compressing messages using redundant content found in previous messages. This embodiment will be described with respect to FIG. 5, which illustrates certain aspects of the message interface 100 in greater detail. At 400, the interface 100 receives a message (or a group of messages) to be transmitted to a particular wireless data processing device 130. At 405, the message is analyzed to determine whether it contains redundant data found in previous messages. In one embodiment, this is accomplished via message identification logic 500 shown in FIG. 5 which scans through previous email messages to locate those messages containing the redundant data.

Various message identification parameters 505 may be used by the message identification logic 500 to search for messages. For example, in one embodiment, the message identification logic will initially attempt to determine whether the new message is the latest in a sequence of messages. Various techniques may be employed by the message identification logic 500 to make this determination. For example, in one embodiment, the message identification logic 500 will search the subject field of the message for the stings which indicate the new message is a response to a prior message. If these strings are identified, the message identification logic 500 may then look for the most recent message in the sequence (e.g., based on the text found in the subject field). For example, referring back to the FIGS. 3a–c, upon receiving message 302, the message identification logic 500 may identify the message 302 as part of a sequence based on the fact that it contains "RE: Patent Issues" in the subject field. The identification logic 500 may ignore the RE: (or FW: if the message is forwarded) and scan to the text in another message which matches the remainder of the subject field (i.e., "Patent Issues") and identify the most recent previous message containing that text in it's subject header.

If the message subject does not contain characters such as RE: or FW: indicating that the message is part of a sequence, then message identification logic 500 may employ a different set of identification parameters 505 for identifying previous messages. For example, in one embodiment, the message identification logic 500 will search for the most recent message in which the sender of the new message is listed in the header (e.g., as the recipient). Moreover, the message identification logic 500 may search for certain keywords or combinations of words indicating that the message contains relevant data (e.g., such as the electronic signature 315 illustrated in FIGS. 3a–c). In one embodiment, the message identification logic 500 may generate a prioritized subset of messages which (based on the defined parameters 505) are the candidates most likely to contain content found in the new message.

Figure 5:
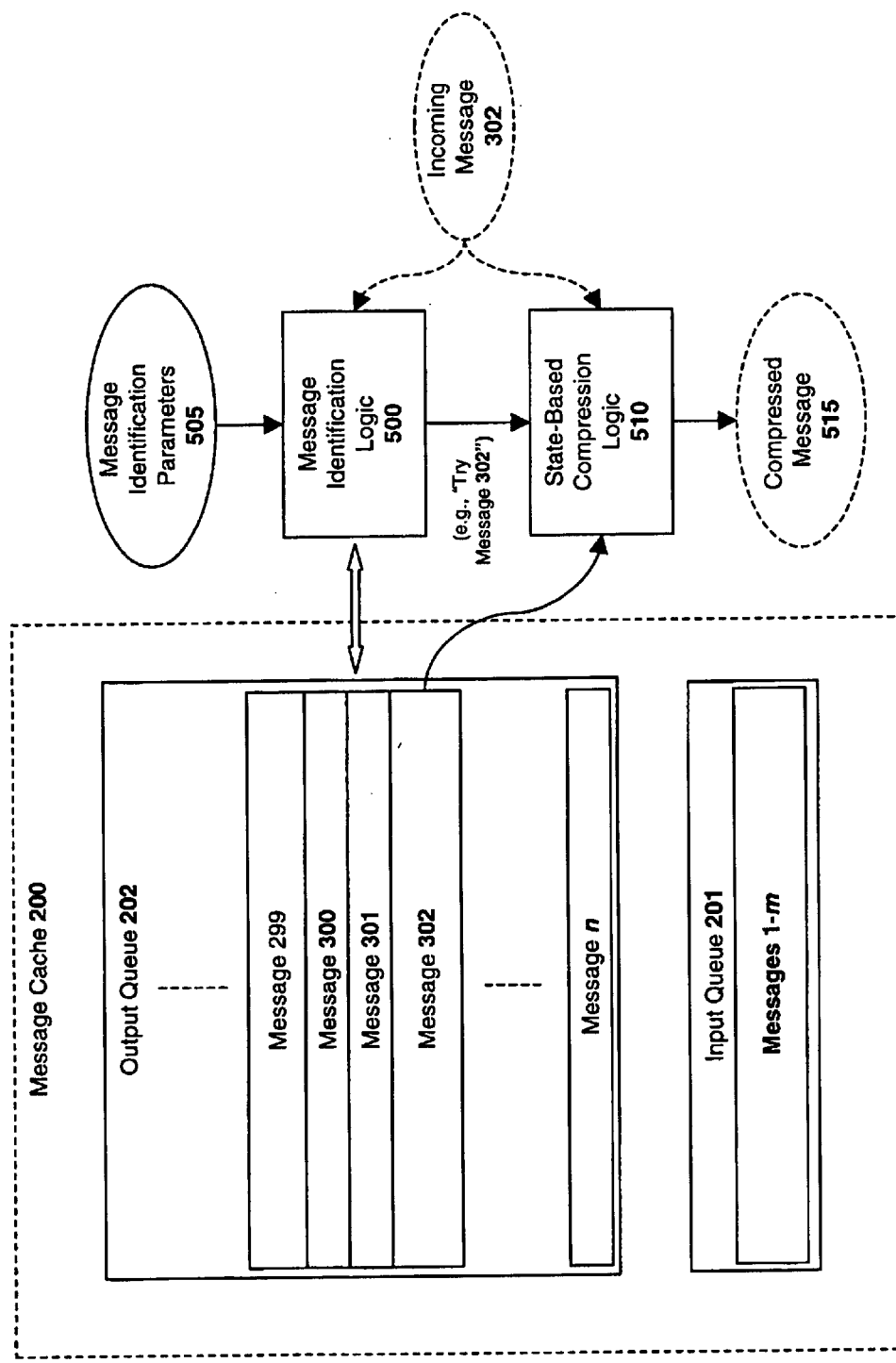
FIG. 5 illustrates one embodiment of an apparatus for performing state-based compression.

If no redundant data exists in prior messages, determined at 410, then at 420 additional compression techniques are applied to compress the message, some of which are described below. If, however, redundant data exists in prior messages then, at 415, the redundant data is replaced with pointers/offsets identifying the redundant data on the cache 210 of the wireless device 130 (or in the cache 200 of the interface 100, depending on the direction of message transmission). As illustrated in FIG. 5, in one embodiment, this is accomplished by state based compression logic 510 which generates the pointers/offsets using the messages identified by the message identification logic 500.

Figure 6:
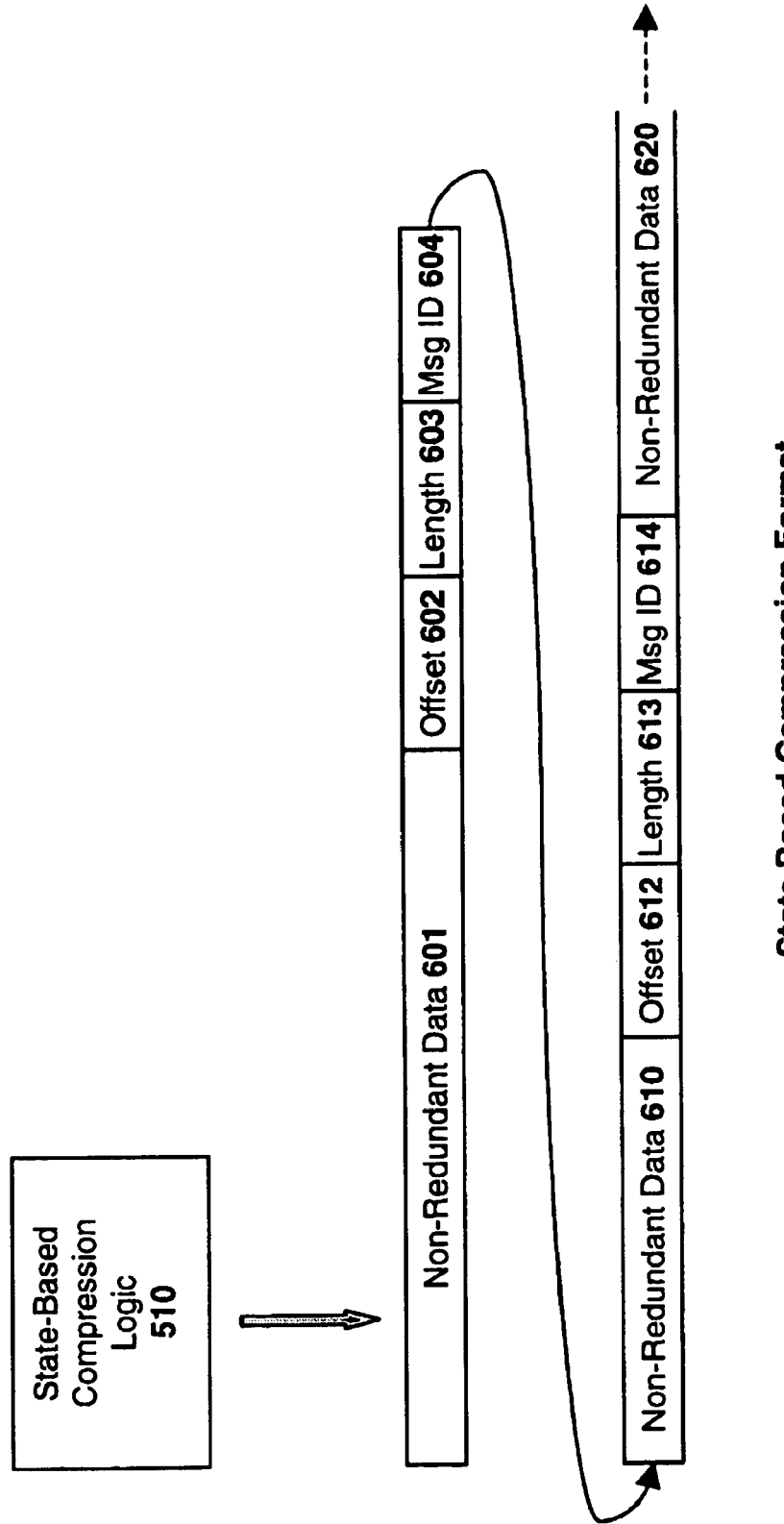
FIG. 6 illustrates one embodiment of a state-based data compression format.

FIG. 6 illustrates one embodiment of a state-based compression format generated by the state-based compression logic 510. As illustrated, the format is comprised of a one or more chunks of non-redundant data 601, 610, 620 separated by offsets 602, 612, lengths 603, 613, and message identification data 604, 614, which identify blocks of data from previous messages. For example, if the compression format of FIG. 6 were used to encode message 302 shown in FIG. 3c, the new text 302 might be stored as non-redundant data 601, whereas all of message 301 might be identified by a particular message ID 604, followed by an offset 602 identifying where to begin copying content from message 301 and a length 603 indicating how much content to read from the address point identified by the offset.

Similarly, if message 301 from FIG. 3b were encoded by the state-based compression logic 510, the new text portion 340 might be stored as non-redundant data 601. Moreover, each of the ">" characters automatically inserted by the email system 316 might be transmitted as non-redundant data, separated by lines of redundant data identified by offsets and lengths (i.e., at the end of each redundant line in message 300 identified by lengths/offsets in the new message, a new, non-redundant ">" would be inserted).

In one embodiment, when a user has not received messages for a long period of time, numerous related messages (e.g., such as messages 300–302) may build up in his inbox on the email service 102. Accordingly, in one embodiment, the interface 100 will employ state-based compression techniques as described above using pointers to messages which have not yet arrived in the cache of the user's wireless device. That is, the interface 100 will determine where messages in the group (stored in the user's inbox on the service 102) will be stored in the cache 210 of the wireless data processing device 130 once the user re-connects to the service.

Referring once again to FIGS. 4 and 5, once the state-based compression logic 510 finishes compressing the message, the compressed message 515 may be transmitted to the user's wireless device 130. Alternatively, at 420, additional compression techniques (described below) may be applied to compress the message further. Once the message is fully compressed it is transmitted to the wireless device (at 425) where it may be decompressed via codec module 225.

The state-based compression techniques were described above in the context of an interface 100 compressing messages before transmitting the messages to a wireless device 130. It will be appreciated, however, that the same compression techniques may be performed by the wireless device 130 before it transmits a message to the interface 100 (e.g., lengths/offsets may identify redundant data stored in the remote message cache 200). In addition, although described above with respect to email messages, the described compression techniques may be employed to compression various other message types (e.g., newsgroup articles, instant messages, HTML documents . . . etc).

Supplemental/Alternative Compression Techniques

Various additional compression techniques may be employed, either in addition to or as an alternative to the state-based compression techniques just described.

In one embodiment of the invention, common characters and strings of characters (i.e., which are frequently transmitted between the wireless device 130 and the interface 100) are encoded using relatively small code words whereas infrequent characters or strings of characters are encoded using relatively larger code words. In order to encode data in this manner, a statistical analysis is performed to identify common character strings. Based on the statistical analysis, a lookup table similar to the one illustrated in FIG. 7 is generated and maintained at both the wireless device 130 and the interface 100. As illustrated, certain character strings such as the domain used for corporate email "@good.com" and the first 6 digits of the corporate telephone number, e.g., "(408) 720-" may be quite common. As such, replacing these common bit strings with relatively small code words may result in a significant amount of compression. Referring back to messages 300–302, using this compression technique, the domain "@good.com" encountered numerous times in each message header could be replaced by a short, several-bit code word.

In one embodiment, a different look up table may be generated for different types of data transmitted between the interface 100 and the wireless data processing device 130, resulting in greater precision when identifying common strings of characters. For example, a different set of code words may be used to compress email messages than that used to compress the corporate address book. Accordingly, the code word table used to compress email messages would likely contain relatively small code words for the most common email domains whereas the corporate address book might also contain relatively small code words for the corporate address and portions of the corporate phone number.

Moreover, in one embodiment, a unique code word table may be generated for each field within a particular type of data. For example, a different code word table may be employed for the email header field than that used for the remainder of the email message. Similarly, a different table may be generated for the "address" field of the corporate address book than that used for the "email address" field, resulting in even greater precision when generating the set of code words.

Rather than statistically generating and transmitting a code word table for each field, alternatively, or in addition, one embodiment of the invention refers to a dictionary of "known" words, like an English dictionary, and therefore does not need to transmit the dictionary with the data. For example, in one embodiment, a spell-check dictionary maintained on the wireless device 130 and/or the interface 100 may be used to compress content. Rather than sending the actual text of the email message, each word in the message would be identified by its entry in the spell-check dictionary (e.g., the word "meeting" might be replaced by entry#3944).

One type of data particularly suitable to the foregoing types of compression is the corporate address book maintained on most corporate email servers. In one embodiment of the invention, the corporate address book is synchronized initially through a direct link to the client 110 (see FIG. 1). On the initial synchronization (e.g., when the wireless device is directly linked to the client 110), statistics on common letters and "tokens" (e.g., names, area codes, email domains) are generated. The statistics and tokens are then used to compress the data as described above. Thereafter, any changes to the address book are wirelessly transmitted. On subsequent updates, the compressors on both sides (wireless device 130 and interface 100) would refer to the earlier statistics gathered, and thus compress without any new statistics or words being transmitted.

The updates may represent a small percentage of the entire address book, but may still represent a significant number of bytes, especially when multiplied by all the wireless devices in use in use at a given company. Accordingly, reducing the amount of data required to transmit the updates to the address book as described above, would result in a significant savings in transmission costs. Additionally, as the address book can be very large relative to the storage available on the client, storing the address book on the client in a compressed form will allow more entries to be stored.

In one embodiment, to conserve additional space, only certain fields of the corporate address book will be synchronized wirelessly. For example, only the Name, Address, Email, and Phone Number fields may be updated wirelessly. All fields of the address book may then be updated when the wireless device is once again directly linked to the client 110.

Figure 8:
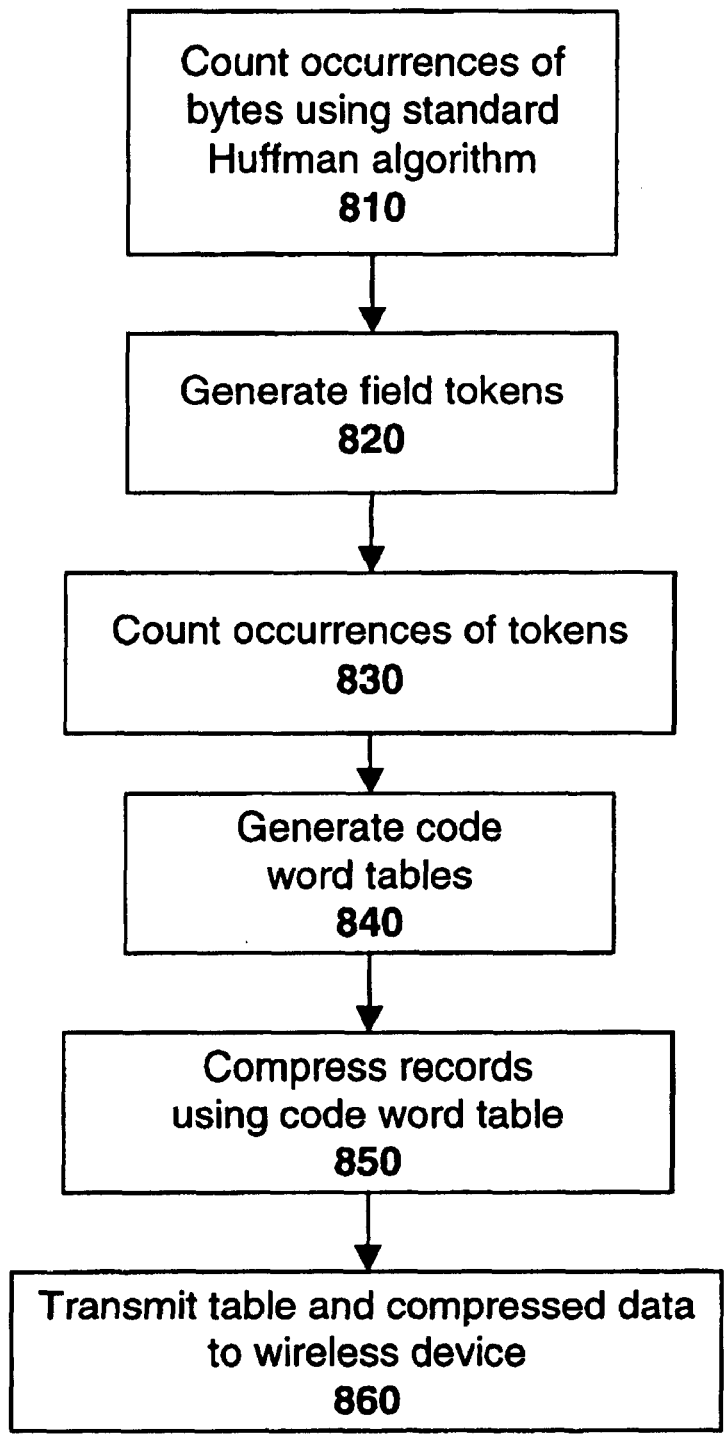
FIG. 8 illustrates one embodiment of a method for compressing data with code words.

One embodiment of a method for generating a code word table is illustrated in FIG. 8. At 810, occurrences of certain byte strings are calculated for use by a standard Huffman compression algorithm. At 820 certain "tokens" are generated for a particular field based on the natural boundaries for that field type. For example, as described above, email addresses could be broken into ".com" and "@good.com" as described above for email fields. Phone numbers might be broken into "(650)" and "(650) 620-" for address book fields.

At 830 the occurrences of tokens are counted in the same way as the occurrences of the byte strings are counted, though one occurrence of, say, a four-byte token adds four to the count. At 840 a code word table of all the letters and those tokens that occur more than once (or maybe the top N tokens that occur more than once) is generated. Part of the table will include the tokens themselves. At 850, each record is compressed using the code word table of characters and tokens and, at 860, the code word tables and the compressed records are then sent to the wireless device 130.

In one embodiment, the code word tables are identified with a unique number, such as a timestamp. Both the interface 100 and the wireless device 130 would store the tables. On the wireless device 130, the records may remain compressed to conserve space, being decompressed only when opened. On subsequent syncs, the wireless device 130 may request updates to the corporate dictionary. As part of the request, the wireless device 130 may include the unique number assigned to the code word tables. If, for some reason, the wireless device 130 doesn't have the original tables, it may send a particular type of ID to notify the interface 100 (e.g., by using a "0" for the ID). Likewise, if the host doesn't recognize the ID for some reason, it can ignore the original tables and create new ones.

In most cases, however, the wireless device 130 and interface 100 will agree on what the ID is, and the compression of the update will use the existing code word tables previously computed. For example, a new employee with the same email domain and phone prefix as existing employees would compress nicely. Since the updates should be a small percentage of the overall address book, it will most likely be very similar to the existing data.

One embodiment of the invention converts alphanumeric characters (e.g., standard ASCII text) into a proprietary variable-bit character format, allocating relatively fewer bits for common characters and relatively more bits for uncommon characters. In one particular embodiment, 6 bits are allocated for most characters, and 12 bits are allocated for all other characters. This embodiment may be seamlessly integrated with the other forms of compression described above (e.g., message pointer generation, code word lookups, . . . etc) through an escape function described below.

Most messages will have ASCII text in them. For example, the TO: field in an email, or the name in an Address Book entry are generally comprised of ASCII text. Most ASCII text use 7 bits/character. Typical exceptions are accented characters, like ñ or õ. Realistically, though, most text in a text field consists of a–z, 0–9, space, and a few symbols.

Compressing text using code word tables as described above is a good way to encode large amounts of text, because it gathers statistics about how frequently a given character occurs, and represents more frequent characters in fewer bits. For example, the letter 'e' occurs more often than the letter 'k', so it may be represented in, say, 3 bits. It is also particularly suitable for compressing data in specific data fields where it is known that the same character strings appear regularly (e.g., such as the email domain "@good.com"). One problem with this technique, however, is that it requires transmitting and storing the statistical information with the encoded text. For small amounts of text (e.g., short email messages), this becomes impractical.

A 6-bit character format provides for 64 characters ($2^6=64$). In one embodiment, the following symbols are encoded using 6-bits: a zero, handy for denoting the end of strings; 'a' through 'z;' '0' through '9;' space; and the most common symbols (e.g., dot, comma, tabs, new-lines, @, parens, !, colon, semicolon, single, double quotes, . . . etc). The values above account for 48 of the 64 values, leaving 16 values remaining.

In one embodiment, the remaining 16 values are used for the following escape values:

(1) Four values for combining with the next 6-bits to allow any possible ASCII value to be encoded in two 6-bit values. It allows for any upper case letter, symbols not in the top ten, accented characters, and so on. For example, binary values of 60, 61, 62, and 63 may each identify another 6-bit value which contains the underlying character information. This provides for the coding of an additional 256 characters (4*64=256), more than enough to encode the entire US-ASCII character set.

(2) Shift Lock. Turns on shifting until a subsequent Shift Lock turns off shifting. For letters, this is like a caps lock. For numbers and symbols, this may have no effect. Alternatively, a second set of values may be defined when shift lock is on (e.g., a second "top ten" list of symbols).

In one embodiment, the remaining 11 6-bit characters are "installable escape values," allowing one or more standard or custom compressors. For example, the TO:, FROM:, CC:, and BCC: fields in an email all contain a list of email addresses, separated by a semicolon. As such, the following special escape values may be defined: (1) the customer's/user's email address may be converted into a 6-bit value; (2) the customer's/user's domain may be converted into a 6-bit value (e.g., "@Good.Com" would become 6 bits); (3) "common" domain names and suffixes may be converted into a 6-bit value and a 6-bit argument (e.g., the "common" list may be 64 of the most common names, and might include "@aol.com", "@webtv.com", ".com", ".net", ".org", ".gov", ".us", ".uk", . . . etc); and (4) names "used recently" in an email may be converted into a 6-bit value and a 6-bit argument. Elsewhere in the message is the email ID this is dependent on. The argument might include 2 bits identifying the field (TO:, FROM:, CC:, or BCC:), and 4 bits identifying the first 16 email addresses in that field.

Figure 9:
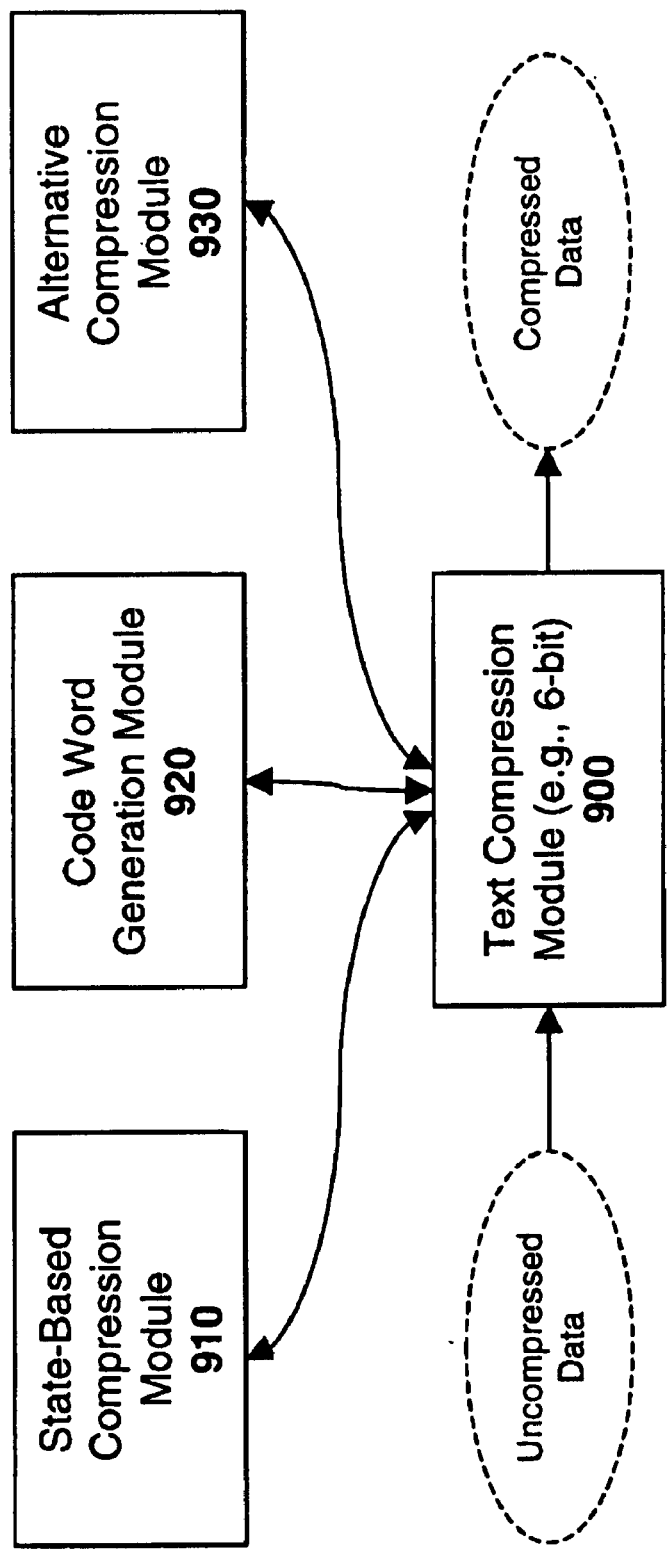
FIG. 9 illustrates a text compression module coordinating data compression tasks between a plurality of other compression modules.

The new character format may be employed seamlessly with the other types of compression described above (e.g., code words, repeated characters; LZ compression; dictionary lookups; and/or referring to prior messages). In one embodiment, illustrated in FIG. 9, a text compression module 900 compresses text according to the 6-bit character format described above and coordinates compression functions between various other compression modules. In the illustrated embodiment, this includes a state-based compression module 910 for compressing messages by referring to prior, cached messages (as described above) and a code word compression module 920 which compresses common character strings using code words (e.g., by encoding statistically-analyzed tokens, referring to a spell-check dictionary, . . . etc, as described above). In addition, as indicated by alternative compression module 930, various other types of compression may be employed on the system to attain an even greater level of compression (e.g., standard LZ compression).

Figure 10:
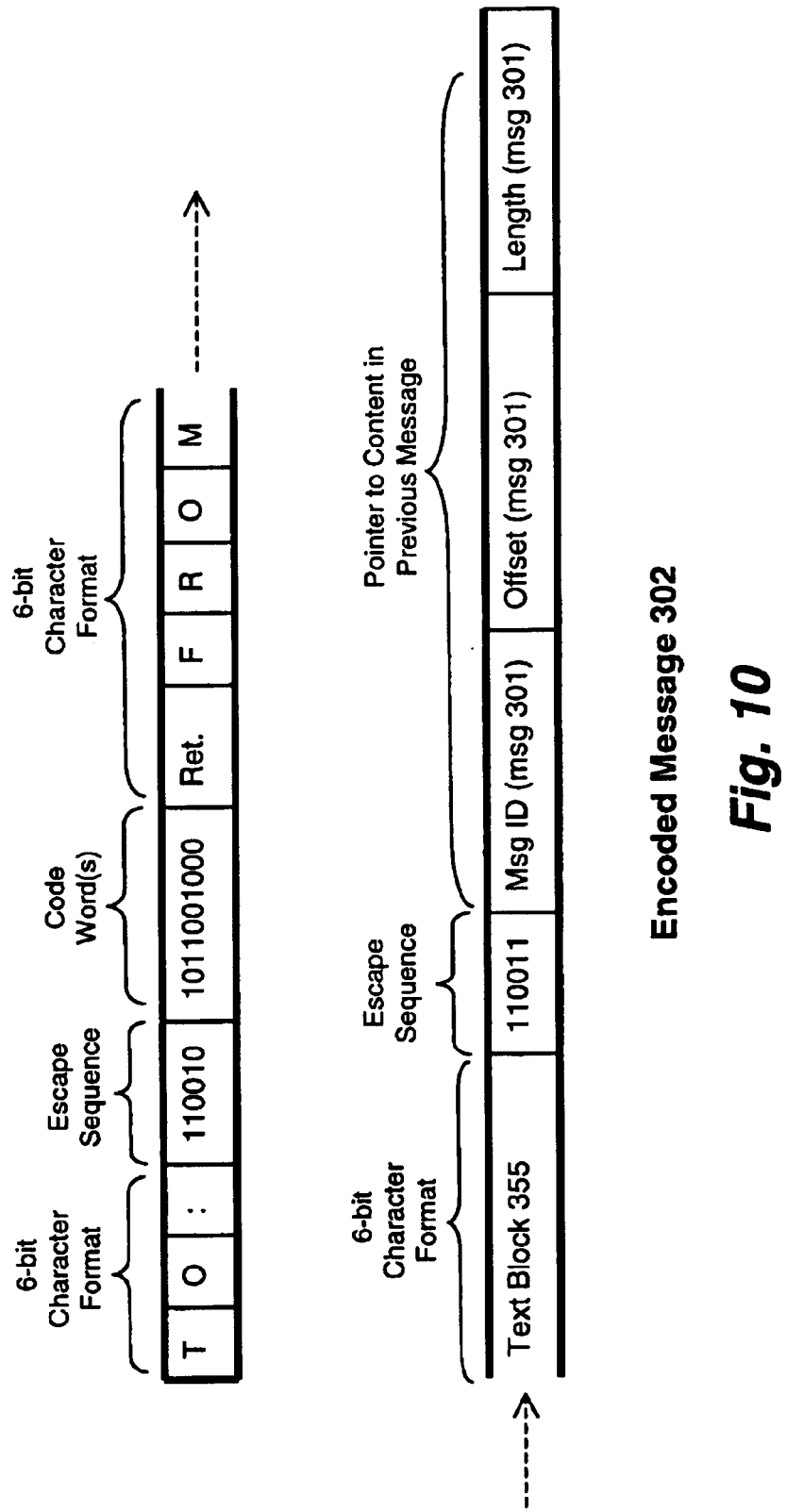
FIG. 10 illustrates a compressed data format according to one embodiment of the invention.

FIG. 10 illustrates an exemplary portion of email message 302 (from FIG. 3c) encoded according to this embodiment of the invention. Starting from the upper right corner of the email message 302, the text compression module 900 begins encoding the first set of characters (i.e., starting with the addressee field "TO:"). With each character it coordinates with the other compression modules 910, 920, 930 to determine whether those modules can achieve greater compression. If not, then the text compression module 900 encodes the text according to the 6-bit character format. If a higher level of compression can be achieved with one of the other compression modules 910, 920, 930, however, the text compression module 900 hands off the compression task to that module and inserts an "escape" sequence of bits indicating where the compression task was accomplished by that module.

For example, as illustrated in FIG. 10, the escape sequence "110010" following the first three characters ("TO:") indicates that the code word generation module 920 compresses the subsequent portion of data. In operation, once this point in the email message is reached, the code word generation module 920 notifies the text compression module 900 that it can achieve a higher level of compression using code words (e.g., using a tokenized email address). Accordingly, the sequence "1011001000" following the escape sequence "110010" is a code word representing the tokenized email address "Collins, Roger" <rcollins@good.com>. Alternatively, two or more code words may be used to encode the email address, depending on the particular set of code words employed by the system (e.g., one for the individual's name and a separate one for the domain "@good.com"). As indicated in FIG. 10, the text compression module 900 may then pick up the encoding process following the tokenized email address (i.e., the return character followed by the text "FROM:").

After the email header information is encoded, the block of new text 355 is encoded using the 6-bit character format. Of course, depending on the code words employed by the code word generation module 920 and/or previous emails on the system, portions of the block of new text 355 may also be encoded using code words and/or pointers to previous messages. Following the text block 355, the state-based compression module 910, after analyzing the message, notifies the text compression module 900 that it can achieve a higher level of compression by identifying content found in a previous message. As such, an escape sequence "110011" is generated indicating that compression is being handled by the state-based compression module 910 from that point onward. The state-based compression logic 910 then identifies a previous email message using a message ID code (indicating message 301), and generating an offset and a length indicating specific content within that email message (e.g., employing one or more of the state-based compression techniques described above).

It should be noted that the specific example shown in FIG. 10 is for the purpose of illustration only. Depending on the code words employed by the system and/or the previous messages stored on the system, the actual encoding of the email message 302 may turn out to be different than that illustrated. For example, as mentioned above, the block of text 355 may be encoded using code words and/or pointers to previous messages as well as the 6-bit character format.

Various supplemental/alternative compression techniques may also be employed (e.g., represented by alternate compression module 930). In one embodiment, certain types of data are not transmitted wirelessly between the wireless data processing device 130 and the interface 100. For example, in one embodiment, when a device has been unable to receive messages for a certain period of time (e.g., one week), only message headers are initially transmitted to the device 130, thereby avoiding an unreasonably long download period (i.e., wherein all messages received over the period of unavailability are transmitted to the device). Alternatively, or in addition, in one embodiment, when the device is out of touch for an extended period of time, only relatively new messages (e.g., received over a 24-hour period) are transmitted to the device when it comes back online. Similarly, in one embodiment, only email header information is transmitted to the wireless device 130 (e.g., indicating the subject and the sender) when the user is a CC addressee and/or when the email is from a folder other than the user's inbox.

In one embodiment, only certain fields are updated on the device 130. For example, with respect to a corporate or personal address book, only Name, Email Address and Phone Number fields may be synchronized on the device 130. When the device is connected directly to the client, all of the fields may then be updated.

In one embodiment, certain details are stripped from email messages to make them more compact before transmitting them to the device 130. For example, only certain specified header information maybe transmitted (e.g., To, From, CC, Date, Subject, body, . . . etc). Similarly, the subject line may be truncated above a certain size (e.g., after 20 characters). Moreover, attachments and various formatting objects (e.g., embedded pictures) may not be transmitted. In one embodiment, when a user lists him/herself as a CC addressee on an outgoing message, this message will not be retransmitted back to the wireless device 130.

Although attachments may not be transmitted to the wireless device 130, in one embodiment, users may still forward the attachments to others from the wireless device (the attachments will, of course, be stored on the email server). Moreover, in one embodiment, attachments may be sent to a fax machine in response to a user command from the wireless device 130. Accordingly, if a user is away from the office and needs to review a particular attachment, he can type in the number of a nearby fax machine and transmit this information to the interface 100. The interface 100 will then open the attachment using a viewer for the attachment file type (e.g., Word, Power Point, . . . etc) and transmit the document via a fax modem using the fax number entered by the user. Thus, the user may view the attachment without ever receiving it at the device.

Embodiments of the invention may include various steps as set forth above. The steps may be embodied in machine-executable instructions. The instructions can be used to cause a general-purpose or special-purpose processor to perform certain steps. Alternatively, these steps may be performed by specific hardware components that contain hardwired logic for performing the steps, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Throughout the foregoing description, for the purposes of explanation, numerous specific details were set forth in order to provide a thorough understanding of the invention. It will be apparent, however, to one skilled in the art that the invention may be practiced without some of these specific details. For example, while illustrated as an interface 100 to a service 102 executed on a server 103 (see FIG. 1), it will be appreciated that the underlying principles of the invention may be implemented on a single client in which the client forwards data over a network. Moreover, although described in the context of a wireless data processing device, the underlying principles of the invention may be implemented to compress data in virtually any networking environment, both wired and wireless. Accordingly, the scope and spirit of the invention should be judged in terms of the claims which follow.

What is claimed is:

1. A method for compressing an electronic message comprising:
    identifying a block of data within said electronic message which is found in a previous electronic message;
    generating a pointer identifying said block of data in said previous electronic message; and
    replacing said block of data in said electronic message with said pointer; and
    transmitting said electronic mail message to a wireless data processing device having said previous electronic mail message stored thereon.

2. The method as in claim 1 further comprising:
    compressing said electronic message further using one or more alternate compression techniques.

3. The method as in claim 2 wherein one of said alternate compression techniques comprises:
   replacing common strings of characters with one or more code words.

4. The method as in claim 3 wherein one of said strings of characters is an electronic mail (email) address domain.

5. The method as in claim 1 further comprising:
   identifying said previous electronic mail message based on characters in a subject field of said message.

6. The method as in claim 5 wherein said characters include text indicating that said electronic mail message is a response to said previous electronic mail message.

7. The method as in claim 5 further comprising:
   decompressing said electronic message by inserting said block of data from said previous electronic message into said message.

8. The method as in claim 1 further comprising:
   encoding portions of text in said electronic message not in said block of data using 6-bits per character.

9. A system comprising:
   message identification logic for identifying a previous electronic message which contains a block of data found in a new electronic message;
   state-based compression logic for compressing said new electronic message by replacing said block of data with a pointer identifying said block of data in said previous electronic message; and
   transmission logic for transmitting said new electronic mail message to a wireless data processing device having said previous electronic mail message stored thereon.

10. The system as in claim 9 further comprising:
    one or more alternate compression modules for compressing said new electronic message further using one or more alternate compression techniques.

11. The system as in claim 10 wherein one of said alternate compression modules comprises:
    a code word generation module which replaces common strings of characters with one or more code words.

12. The system as in claim 11 wherein one of said strings of characters is an electronic mail (email) address domain.

13. The system as in claim 10 wherein one of said alternate compression modules comprises a 6-bit text encoding module to encode portions of text in said new electronic message not in said block of data using 6-bits per character.

14. The system as in claim 9 wherein said message identification logic identifies said previous electronic mail message based on characters in a subject field of said new electronic mail message.

15. The system as in claim 14 wherein said characters include text indicating that said new electronic mail message is a response to said previous electronic mail message.

16. The system as in claim 9 further comprising:
    decompression logic to decompress said electronic message on said wireless data processing device by inserting said block of data from said previous electronic message into said new electronic message.

17. A method comprising:
    providing an interface to a message service, said interface compressing messages and forwarding said compressed messages to a data processing device,
    wherein said interface compresses an electronic message by searching for prior electronic messages transmitted to or received from said data processing device which include a block of data found in said electronic message and replacing said block of data with a pointer to said block of data in said prior electronic mail messages; and
    transmitting said electronic mail message to a wireless to a wireless data processing device having previous electronic mail message stored.

18. The method as in claim 17 wherein said interface further compresses said electronic mail message further using one or more alternate compression techniques.

19. The method as in claim 18 wherein one of said alternate compression techniques comprises:
    replacing common strings of characters with one or more code words.

20. The method as in claim 19 wherein one of said strings of characters is an electronic mail (email) address domain.

21. The method as in claim 17 wherein said interface identifies said previous electronic mail message based on characters in a subject message of said electronic mail message.

22. The system as in claim 21 wherein said characters include text indicating that said electronic mail message is a response to said previous electronic message.

23. The method as in claim 17 further comprising:
    decompressing said electronic message at said data processing device by inserting said block of data from said previous electronic message into said electronic message.

24. The method as in claim 17 wherein said interface further compresses said electronic message by encoding portions of text in said electronic message not in said block of data using 6-bits per character.

* * * * *